United States Patent
Kuo et al.

(10) Patent No.: US 9,758,372 B1
(45) Date of Patent: Sep. 12, 2017

(54) MEMS PACKAGE WITH MEMS DIE, MAGNET, AND WINDOW SUBSTRATE FABRICATION METHOD AND STRUCTURE

(71) Applicant: Amkor Technology, Inc., Chandler, AZ (US)

(72) Inventors: Bob Shih-Wei Kuo, Chandler, AZ (US); Shaun Michael Bowers, Gilbert, AZ (US); Russell Scott Shumway, Mesa, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 117 days.

(21) Appl. No.: 13/766,171

(22) Filed: Feb. 13, 2013

(51) Int. Cl.
| | |
|---|---|
| H01L 23/02 | (2006.01) |
| H01L 23/34 | (2006.01) |
| H01L 23/04 | (2006.01) |
| H01L 23/48 | (2006.01) |
| H01L 23/52 | (2006.01) |
| H01L 29/40 | (2006.01) |
| B81C 1/00 | (2006.01) |
| B81B 7/00 | (2006.01) |

(52) U.S. Cl.
CPC ........ *B81C 1/00333* (2013.01); *B81B 7/0077* (2013.01)

(58) Field of Classification Search
CPC ..... H01L 2924/01029; H01L 27/14618; H01L 2924/01079; H01L 2924/14; H01L 2924/15311; H01L 2924/01013; H01L 2224/16; H01L 2224/48091; H01L 23/10; H01L 23/4006; H01L 25/105

USPC ....... 257/680, 685, 723, 730, 731, 733, 778, 257/779, 782, 783, 786
See application file for complete search history.

(56) References Cited

U.S. PATENT DOCUMENTS

| | | | |
|---|---|---|---|
| 6,432,737 B1 | 8/2002 | Webster | |
| 6,525,944 B1 | 2/2003 | Li | |
| 6,809,413 B1* | 10/2004 | Peterson et al. | 257/680 |
| 6,846,725 B2* | 1/2005 | Nagarajan et al. | 438/456 |
| 8,188,557 B2* | 5/2012 | Rombach et al. | 257/416 |
| 8,205,497 B1* | 6/2012 | Okandan | G01C 19/5712 73/514.26 |
| 2007/0058826 A1* | 3/2007 | Sawamoto | H04R 19/04 381/174 |
| 2008/0122071 A1* | 5/2008 | Tseng et al. | 257/720 |
| 2008/0135959 A1* | 6/2008 | Theuss et al. | 257/427 |
| 2010/0087024 A1* | 4/2010 | Hawat | B81B 7/0077 438/51 |

(Continued)

OTHER PUBLICATIONS

Kuo et al., "Microfluidics Sensor Package Fabrication Method and Structure," U.S. Appl. No. 13/793,541, filed Mar. 11, 2013.

*Primary Examiner* — Kimberly Rizkallah
*Assistant Examiner* — Dilinh Nguyen
(74) *Attorney, Agent, or Firm* — McAndrews, Held & Malloy, Ltd.

(57) ABSTRACT

A method includes mounting a window substrate to a carrier tape. The window substrate has a window extending between an upper surface of the window substrate and a lower surface of the window substrate, the carrier tape sealing the window at the lower surface. Bond pads on an active surface of a MEMS die are flip chip mounted to terminals on the upper surface of the window substrate, a MEMS active area of the MEMS die being aligned with the window of the window substrate. A magnet is mounted to an inactive surface of the MEMS die.

30 Claims, 4 Drawing Sheets

(56) References Cited

U.S. PATENT DOCUMENTS

2010/0219521 A1\* 9/2010 Lee et al. .................... 257/680

\* cited by examiner

MEMS PACKAGE WITH MEMS DIE, MAGNET, AND WINDOW SUBSTRATE FABRICATION METHOD AND STRUCTURE

TECHNICAL FIELD

The present application relates to the field of electronics, and more particularly, to methods of forming electronic component packages and related structures.

BACKGROUND

A Micro Electro Mechanical Systems (MEMS) package typically includes a MEMS die, sometimes called a MEMS electronic component. A MEMS die includes a MEMS active area in which miniature mechanical elements are located. Movement of these miniature mechanical elements is either produced or sensed to perform various functions.

For example, these miniature mechanical elements, e.g., an array of miniature moveable micromirrors, are placed within a magnetic field, e.g., provided by a permanent magnet. An electronic excitation signal is then provided to the miniature mechanical elements to create a temporary magnetic polarity thus causing the elements to move within the magnetic field.

Conversely, external excitations such as sound waves, pneumatic pressure, or inertial force, cause the miniature mechanical elements to move within the magnetic field thus producing an excitation signal, which is sensed.

The MEMS active area in which the miniature mechanical elements are located is often unprotected during manufacture of the MEMS package leading to damage or destruction of the MEMS die and the associate MEMS package. Further, to avoid demagnetizing the permanent magnet, only low temperature heating of the MEMS package during fabrication is used thus undesirably restricting the use of materials and processes to low temperature options.

BRIEF DESCRIPTION OF THE DRAWINGS

In the following description, the same or similar elements are labeled with the same or similar reference numbers.

DETAILED DESCRIPTION

Figure 3:
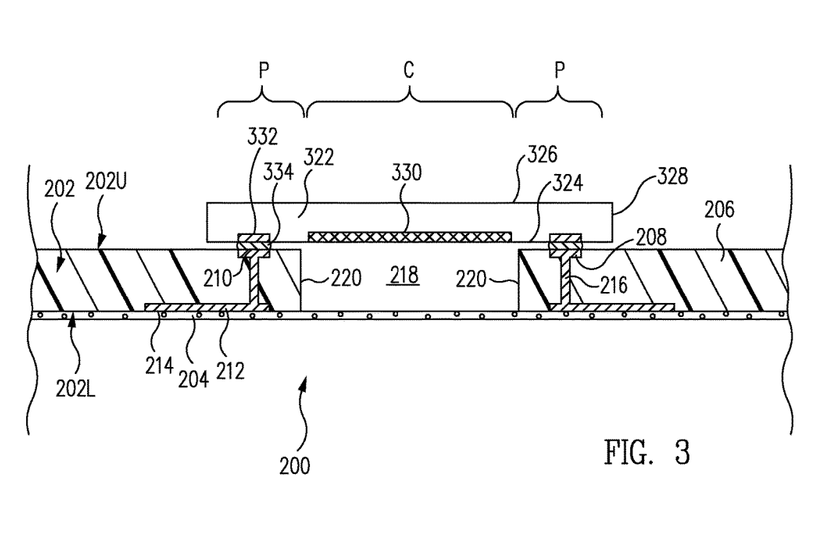
FIGS. 3, 4, 5, 6 are cross-sectional views of the MEMS package of FIG. 2 at further stages during fabrication in accordance with various embodiments.

As an overview and in accordance with one embodiment, referring now to FIG. 3, a method of fabricating a MEMS package 200 includes mounting a window substrate 202 to a carrier tape 204. Window substrate 202 has a window 218 extending between an upper surface 202U of window substrate 202 and a lower surface 202L of window substrate 202. Carrier tape 204 seals window 218 at lower surface 202L.

Bond pads 332 on an active surface 324 of a MEMS die 322 are flip chip mounted to terminals 210 on upper surface 202U of window substrate 202 such that a MEMS active area 330 of MEMS die 322 is aligned with window 218 of window substrate 202. Carrier tape 204 acts as a protective seal to protect MEMS active area 330, e.g., during fabrication and shipping of MEMS package 200.

Further, by aligning MEMS active area 330 with window 218, only the peripheral portion P of MEMS die 322 is connected to window substrate 202. More particularly, the central portion C of MEMS die 322 is uncoupled from window substrate 202. By uncoupling central portion C of MEMS die 322 from window substrate 202, stress imparted by window substrate 202 on central portion C of MEMS die 322 including MEMS active area 330 located therein is minimized or eliminated.

Figure 4:
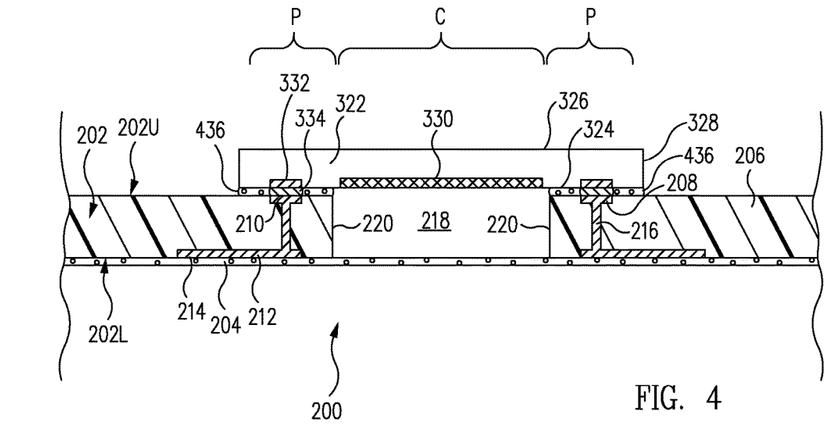
Figure 5:
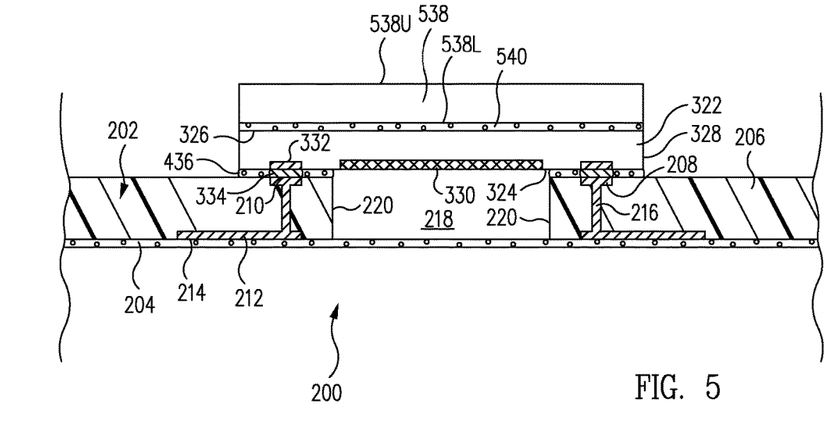

Referring now to FIG. 4, a sealant 436 is dispensed between active surface 324 of MEMS die 322 and upper surface 202U of window substrate 202. Referring now to FIG. 5, a magnet 538 is mounted to an inactive surface 326 of MEMS die 322.

In one embodiment, magnet 538 is attached subsequent to both flip chip mounting of MEMS die 322 and dispensing of sealant 436. Accordingly, high-temperature processing can be used during flip chip mounting of MEMS die 322 and dispensing of sealant 436 without demagnetizing magnet 538, as magnet 538 is not present during these operations.

By allowing high-temperature processing during flip chip mounting of MEMS die 322 and dispensing of sealant 436, low-cost materials can be used to fabricate MEMS package 200 as compared to a MEMS package fabricating using low-temperature materials to avoid heating and demagnetizing a magnet.

In one embodiment, after mounting of magnet 538 to inactive surface 326 of MEMS die 322, magnet 538 is magnetized. Magnet 538 is directly exposed from MEMS package 200 thus allowing magnetization of magnet 538 to be readily performed in contrast to a MEMS package having a magnet buried within the MEMS package.

In one embodiment, magnet 538 is not yet magnetized during mounting of magnet 538 to inactive surface 326 of MEMS die 322. Accordingly, strong magnetic components are not handled during assembly of MEMS package 200 and a high-temperature adhesive 540 can be used to mount magnet 538. By avoiding handling of strong magnetic components during fabrication and by using a high temperature adhesive 540 to mount magnet 538, the manufacturing cost of MEMS package 200 is minimized.

Figure 1:
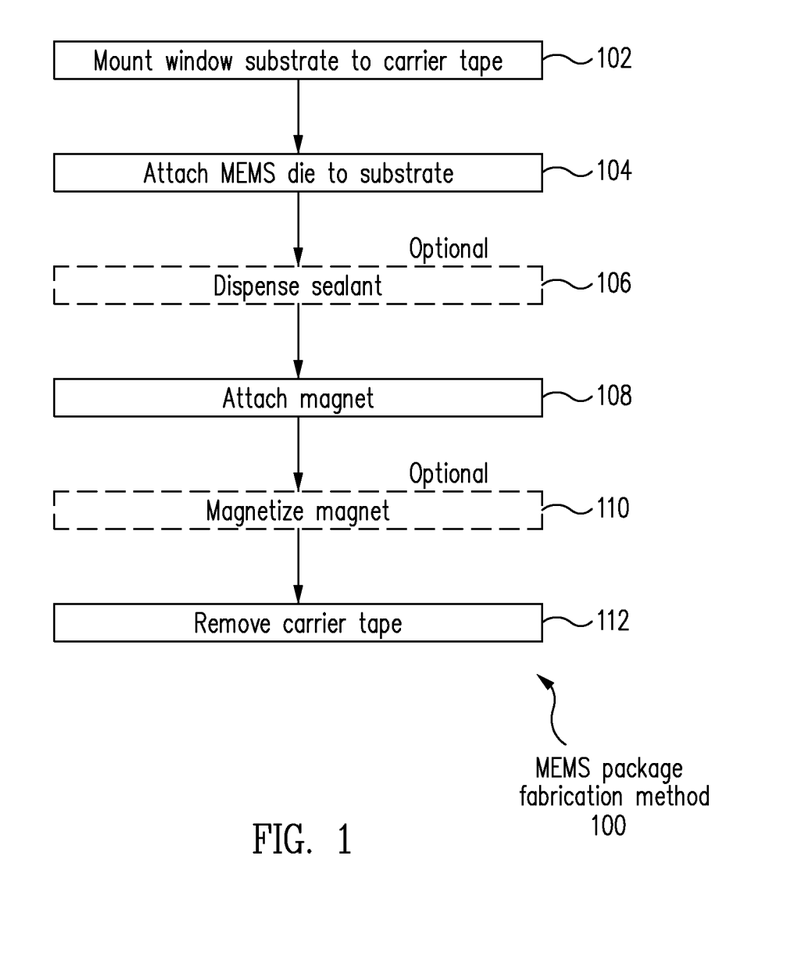
FIG. 1 is a block diagram of a MEMS package fabrication method in accordance with one embodiment.
Figure 2:
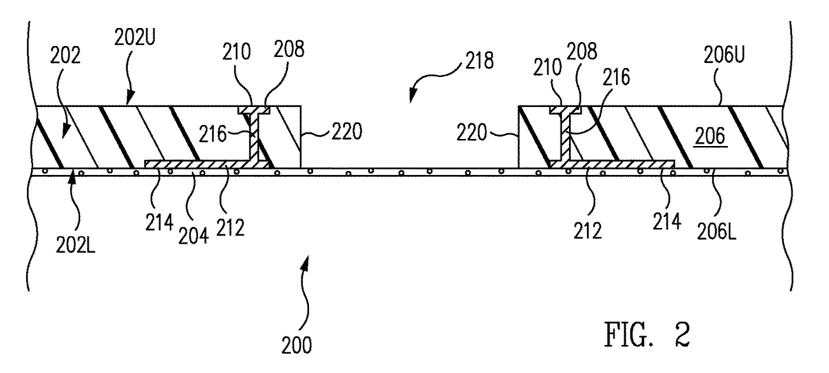
FIG. 2 is a cross-sectional view of a MEMS package during fabrication in accordance with one embodiment.

Now in more detail, FIG. 1 is a block diagram of a Micro Electro Mechanical Systems (MEMS) package fabrication method 100 in accordance with one embodiment. FIG. 2 is a cross-sectional view of a MEMS package 200 during fabrication in accordance with one embodiment.

Referring now to FIGS. 1 and 2 together, in a mount window substrate to carrier tape operation 102, a window substrate 202 is mounted to a carrier tape 204. In one embodiment, window substrate 202 is pre-mounted on carrier tape 204.

Window substrate 202, sometimes called a framed substrate, includes a substrate core 206 including an upper, e.g., first, surface 206U and an opposite lower, e.g., second, surface 206L. Substrate core 206 is a dielectric material such as laminate, ceramic, printed circuit board material, or other dielectric material.

Embedded within upper surface 206U of substrate core 206 are electrically conductive upper, e.g., first, traces 208, e.g., formed of copper. Upper traces 208 include terminals 210.

Embedded within lower surface 206L of substrate core 206 are lower, e.g., second, traces 212. Lower traces 212 including electrically conductive lands 214.

Lower traces 212 are electrically connected to upper traces 208 by electrically conductive vias 216 extending through substrate core 206 between upper surface 206U and lower surface 206L.

Although upper traces 208 are illustrated as being embedded within upper surface 206U of substrate core 206, in other embodiments, upper traces 208 are partially embedded into substrate core 206 or completely on top of upper surface 206U. Similarly, although lower traces 212 are illustrated as being embedded within lower surface 206L of substrate core 206, in other embodiments, lower traces 212 are partially embedded into substrate core 206 or completely on top of lower surface 206L.

Although not illustrated, window substrate 202 can include dielectric solder masks on upper surface 206U and lower surface 206L. For example, the upper solder mask protects, i.e., covers, first portions of upper traces 208 while exposing second portions, e.g., terminals 210, of upper traces 208. The lower solder mask protects, i.e., covers, first portions of lower traces 212 while exposing second portions, e.g., lands 214, of lower traces 212. The upper and lower solder masks are optional, and in one embodiment, are not formed.

Generally, window substrate 202 includes an upper, e.g., first, surface 202U and an opposite lower, e.g., second, surface 202L. Upper surface 202U is defined by the upper solder mask, by upper surface 206U of substrate core 206, and/or by any other structure which forms upper surface 202U of window substrate 202. Similarly, lower surface 202L is defined by the lower solder mask, by lower surface 206L of substrate core 206, and/or by any other structure which forms lower surface 202L of window substrate 202.

Although a particular electrically conductive pathway between upper traces 208 and lower traces 212 is described above, other electrically conductive pathways can be formed. For example, contact metallizations can be formed between the various electrical conductors.

Further, instead of straight through vias 216, in one embodiment, a multilayer substrate includes a plurality of vias and/or internal traces that form the electrical interconnection between upper traces 208 and lower traces 212.

In one embodiment, lands 214 are distributed in an array thus forming a Land Grid Array (LGA). However, in other embodiments, other package configurations other than a LGA are used. For example, a lead frame configuration is used. In another embodiment, interconnection balls, e.g., lead free solder balls, are formed on lands 214 at later stages of fabrication to form a Ball Grid Array (BGA).

Windows substrate 202 includes a window 218. Window 218 is an opening, sometimes called a hole, an aperture, an open frame, or an open window, extending through window substrate 202. More particularly, window 218 extends between upper surface 202U and lower surface 202L of window substrate 202.

Window 218 is defined by window sidewalls 220 of substrate 202. Window sidewalls 220 extend between upper surface 202U and lower surface 202L of window substrate 202.

Lower surface 202L of window substrate 202 is mounted to carrier tape 204. In one embodiment, carrier tape 204 is adhesive and thus lower surface 202L of window substrate 202 is pressed into carrier tape 204 to mount window substrate 202 to carrier tape 204.

Carrier tape 204 extends across window 218 at lower surface 202U of window substrate 202. Accordingly, carrier tape 204 seals window 218 at lower surface 202U of window substrate 202.

FIG. 3 is a cross-sectional view of MEMS package 200 of FIG. 2 at a further stage during fabrication in accordance with one embodiment. Referring now to FIGS. 1 and 3 together, from mount window substrate to carrier tape operation 102, flow moves to an attach MEMS die to substrate operation 104. In attach MEMS die to substrate operation 104, a MEMS die 322 is attached to window substrate 202.

More particularly, MEMS die 322 includes an active surface 324 and an opposite inactive surface 326. MEMS die 322 further includes sides 328 extending perpendicularly between active surface 324 and inactive surface 326. Although various features may be described as parallel, perpendicular, or having other relations, in light of this disclosure, those of skill in the art will understand that the features may not be exactly parallel or perpendicular, but only substantially parallel or perpendicular, e.g., to within accepted manufacturing tolerances.

Formed on active surface 324 are a MEMS active area 330 and one or more bond pads 332. MEMS active area 330 is an area on active surface 324 in which miniature mechanical elements are located. Movement of these miniature mechanical elements is either produced or sensed to perform various functions as those of skill in the art will understand in light of this disclosure. Excitation signals associated with the movement of the miniature mechanical elements are input and/or output on bond pads 332.

MEMS die 322 is sometimes called a MEMS/sensor die depending upon the function of MEMS die 322. Further, MEMS active area 330 is sometimes said to contain MEMS/sensor elements depending upon the function of MEMS die 322.

Bond pads 332 are flip chip mounted to terminals 210 of upper traces 208 by flip chip bumps 334, e.g., solder, copper, electrically conductive epoxy, or other electrically conductive material. Generally, flip chip bumps 334 electrically and mechanically mount MEMS die 322 to window substrate 202. By using flip chip bumps 334, relatively complex wire bonding and protective glob top processes are avoided.

MEMS die 322 is mounted to window substrate 202 such that MEMS active area 330 is aligned with window 218. However, window 218 is sealed and protected by carrier tape 204. Accordingly, MEMS active area 330 is sealed and protected by carrier tape 204. Stated another way, carrier tape 204 acts as a protective seal to protect MEMS active area 330, e.g., during fabrication and shipping of MEMS package 200.

Further, by aligning MEMS active area 330 with window 218, only the peripheral portion P of MEMS die 322 is connected to window substrate 202. More particularly, the central portion C of MEMS die 322 is uncoupled from window substrate 202. By uncoupling central portion C of MEMS die 322 from window substrate 202, stress imparted by window substrate 202 on central portion C of MEMS die 322 is minimized or eliminated.

In one embodiment, central portion C includes MEMS active area 330. Peripheral portion P surrounds MEMS active area 330 and central portion C and is directly adjacent sides 328. By minimizing or eliminating stress on MEMS active area 330 as described above, malfunction, damage, or destruction from stress imparted on MEMS die 322 is minimized.

FIG. 4 is a cross-sectional view of MEMS package 200 of FIG. 3 at a further stage during fabrication in accordance with one embodiment. Referring now to FIGS. 1 and 4 together, from attach MEMS die to substrate operation 104, flow moves, optionally, to a dispense sealant operation 106.

In dispense sealant operation 106, a sealant 436 is dispensed between MEMS die 322 and window substrate 202.

More particularly, a dielectric sealant 436, e.g., an underfill, is dispensed between active surface 324 of MEMS die 322 and upper surface 202U of window substrate 202, e.g., adjacent sides 328. Sealant 436 fills the region between active surface 324 of MEMS die 322 and upper surface 202U of window substrate 202, e.g., due to capillary action. Sealant 436 further encloses and protects flip chip bumps 334 and generally enhances the bond between MEMS die 322 and window substrate 202.

Sealant 436 extends inwards from sides 328 of MEMS die 322 to window sidewalls 220. For example, upon reaching window sidewalls 220, capillary action drawing sealant 436 inward ceases and thus sealant 436 does not extend inwards past window sidewalls 220. As MEMS active area 330 is located inward of window sidewalls 220, sealant 436 does not extend into or contaminate MEMS active area 330. However, sealant 436 protects MEMS active area 330 from contaminants passing between MEMS die 322 and window substrate 202.

Generally, sealant 436 is located between peripheral portion P of MEMS die 322 and upper surface 202U of window substrate 202. Sealant 436 does not extend into or contact central portion C of MEMS die 322 in which MEMS active area 330 is located.

Dispense sealant operation 106 is optional, and in one embodiment, is not performed.

FIG. 5 is a cross-sectional view of MEMS package 200 of FIG. 4 at a further stage during fabrication in accordance with one embodiment. Referring now to FIGS. 1 and 5 together, from dispense sealant operation 106 (or directly from attach MEMS die to substrate operation 104 in the event that optional dispense sealant operation 106 is not performed), flow moves to an attach magnet operation 108. In attach magnet operation 108, a magnet 538 is attached to MEMS die 322.

More particularly, a lower, e.g., first, surface 538L of magnet 538 is attached to inactive surface 326 of MEMS die 322 with a magnet adhesive 540, e.g., an epoxy adhesive. An upper, e.g., second, surface 538U of magnet 538 is exposed to the ambient environment. Generally, magnet 538 is exposed to the ambient environment Magnet 538 is a material or object that produces a magnetic field when magnetized. More particularly, magnet 538 produces a magnetic field that pulls on other ferromagnetic materials, such as iron, nickel, and cobalt, and attracts or repels other magnets depending on whether similar or opposite polarity is orientated towards magnet 538. MEMS active area 330 is located within the magnetic field produced by magnet 538.

In one embodiment, magnet 538 is a permanent magnet. In accordance with this embodiment, magnet 538 is made from a material that is magnetized and creates its own persistent magnetic field.

Magnet 538 is attached in attach magnet operation 108 and subsequent to both attach MEMS die to substrate operation 104 and dispense sealant operation 106. Accordingly, high-temperature processing, i.e., processing at temperatures sufficient to demagnetize magnet 538, can be used in attach MEMS die to substrate operation 104 and/or dispense sealant operation 106 without demagnetizing magnet 538, as magnet 538 is not present in operations 104, 106.

For example, MEMS package 200 is heated to a high temperature sufficient to reflow flip chip bumps 334 in attach MEMS die to substrate operation 104. In accordance with another example, MEMS package 200 is heated to a high temperature sufficient to cure sealant 436 in dispense sealant operation 106. By allowing high-temperature processing during operations 104 and/or 106, low-cost materials can be used to fabricate MEMS package 200 as compared to a MEMS package fabricating using low-temperature materials to avoid heating and demagnetizing a magnet.

From attach magnet operation 108, flow moves, optionally, to a magnetize magnet operation 110. In magnetize magnet operation 110, magnet 538 is magnetized. Illustratively, a magnetizer device is placed near or in direct contact with magnet 538 to apply a strong magnetic field to magnet 538 to magnetize magnet 538 as those of skill the art will understand in light of this disclosure.

Magnet 538 is directly exposed from MEMS package 200 thus allowing the magnetizer device to be easily placed near or in direct contact with magnet 538. Accordingly, magnetization of magnet 538 is readily performed in contrast to a MEMS package having a magnet buried within the MEMS package.

In one embodiment, magnet 538 is not magnetized or only weakly magnetized, sometimes called de-magnetized or not yet magnetized, during attach magnet operation 108. Accordingly, use of special magnetized material handling and/or non-ferromagnetic material equipment to attach magnet 538 is avoided. Stated another way, strong magnetic components are not handled during assembly of MEMS package 200.

For example, magnet 538 is picked and placed on MEMS die 322 by an apparatus containing ferromagnetic materials without having magnet 538 stick to the apparatus due to magnetic attraction. By avoiding use of special magnetized material handling and/or non-ferromagnetic equipment to attach magnet 538, the manufacturing cost of MEMS package 200 is minimized.

Further, as magnet 538 is not magnetized or only weakly magnetized, sometimes called de-magnetized or not yet magnetized, during attach magnet operation 108, magnet adhesive 540 can be a high-temperature adhesive. In one embodiment, a high-temperature adhesive is an adhesive that is cured at a sufficiently high temperature that would cause de-magnetization of magnet 538 if magnet 538 was magnetized. By using a high-temperature adhesive as magnet adhesive 540, curing time of magnet adhesive 540 as well as manufacturing cost of MEMS package 200 are minimized.

However, magnetize magnet operation 110 is optional and in one embodiment is not performed. In accordance with this embodiment, magnet 538 is already magnetized during attach magnet operation 108. In one embodiment, magnet adhesive 540 is a low-temperature adhesive, i.e., an adhesive that is cured at a sufficiently low temperature to avoid de-magnetization of magnet 538, such that demagnetizing heating of magnet 538 during attach magnet operation 108 is avoided.

As illustrated in FIG. 5, window 218 and thus MEMS active area 330 is sealed and protected by carrier tape 204 during operations 104, 106, 108, and 110. In this manner, damage or destruction of MEMS active area 330 during operations 104, 106, 108, and 110 is minimized or eliminated thus maximizing yield and minimizing fabrication cost of MEMS package 200.

Figure 6:
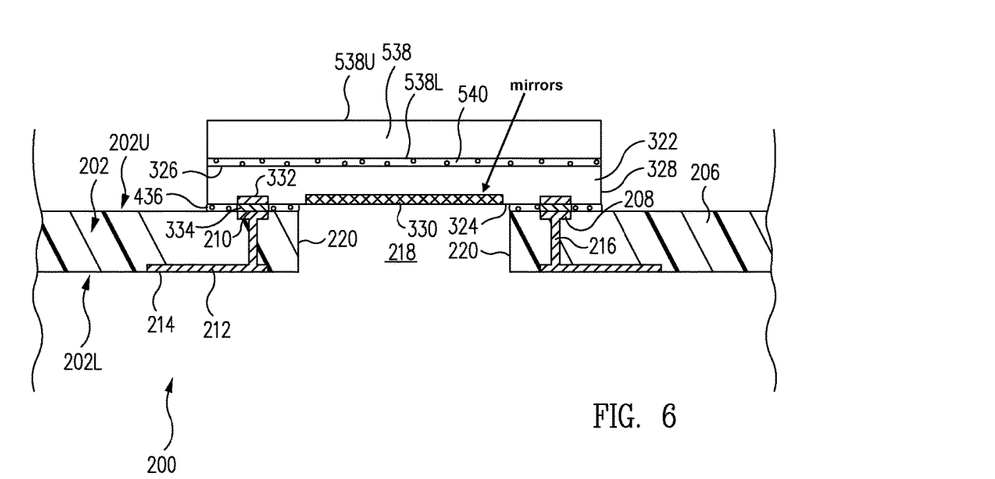

FIG. 6 is a cross-sectional view of MEMS package 200 of FIG. 5 at a further stage during fabrication in accordance with one embodiment. Referring now to FIGS. 1, 5, and 6 together, from magnetize magnet operation 110 (or directly from attach magnet operation 108 in the event that optional magnetize magnet operation 110 is not performed), flow moves to a remove carrier tape operation 112. In removed carrier tape operation 112, carrier tape 204 as illustrated in FIG. 5 is removed as illustrated in FIG. 6. Illustratively, carrier tape 204 is removed by peeling, UV release, thermally, mechanically, chemically, or otherwise.

Upon removal of carrier tape 204, window 218 and thus MEMS active area 330 are exposed to the ambient environment. More particularly, MEMS active area 330 is exposed to the ambient environment through window 218. Further, lower surface 202L of window substrate 202 including lands 214 of lower traces 212 are exposed thus facilitating electrical connection and mounting of MEMS package 200 on a larger substrate, e.g., a printed circuit motherboard.

Although fabrication of a single MEMS package 200 is described above, in another embodiment, a plurality of MEMS packages 200 are fabricated simultaneously, e.g., in a strip or an array. In accordance with one embodiment, the strip or array is singulated prior to remove carrier tape operation 112 so that carrier tape 204 protects MEMS active areas 330 during the singulation operation. Alternatively, MEMS package 200 is fabricated individually.

Figure 7:
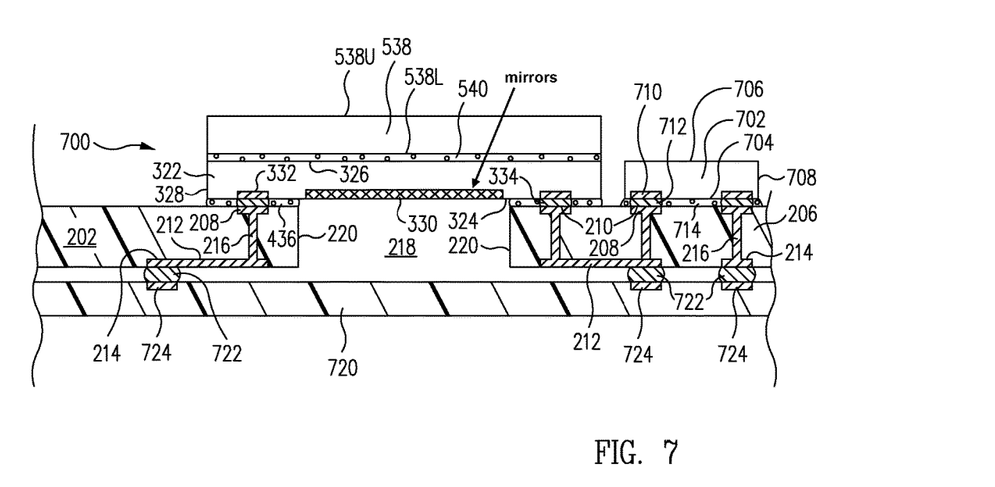
FIG. 7 is a cross-sectional view of a MEMS package mounted on a substrate in accordance with another embodiment.

FIG. 7 is a cross-sectional view of a MEMS package 700 mounted on a substrate 720 in accordance with another embodiment. MEMS package 700 of FIG. 7 is similar to MEMS package 200 as illustrated in FIG. 6 and only the significant differences are discussed below.

Referring now to FIG. 7, in accordance with this embodiment, a second electronic component 702 is mounted to window substrate 202 adjacent MEMS die 322. In one embodiment, second electronic component 702 is an active component such as an integrated circuit chip, e.g., an application-specific integrated circuit (ASIC). In another embodiment, second electronic component 702 is a passive component such as a resistor, capacitor, or inductor.

In accordance with this embodiment, second electronic component 702 includes an active surface 704 and an opposite inactive surface 706. Second electronic component 702 further includes sides 708 extending perpendicularly between active surface 704 and inactive surface 706. Formed on active surface 704 are one or more bond pads 710.

Bond pads 710 are flip chip mounted to terminals 210 of upper traces 208 by secondary flip chip bumps 712, e.g., solder, copper, electrically conductive epoxy, or other electrically conductive material. Generally, flip chip bumps 712 electrically and mechanically mount second electronic component 702 to window substrate 202.

Optionally, an underfill 714 is applied between active surface 704 of second electronic component 702 and upper surface 202U of window substrate 202 to enclose and protect flip chip bumps 712.

In accordance with this embodiment, window substrate 202 is used as an interposer for stacking of second electronic component 702 along with MEMS die 322. Further, by minimizing or eliminating stress on MEMS active area 330 by aligning MEMS active area 330 with window 218, window substrate 202 is utilized for stress relief with stacked dies, i.e., with MEMS die 322 and second electronic component 702.

Although a flip chip mounting of second electronic component 702 by secondary flip chip bumps 712 is discussed above and illustrated in FIG. 7, in other embodiments, other mounting configurations are used.

For example, inactive surface 706 is mounted to upper surface 202U of window substrate 202 with a die attach adhesive. Bond pads 710 are electrically connected to terminals 210 of upper traces 208 by bond wires in a wirebond configuration.

In another embodiment, second electronic component 702 is a passive component mounted using surface mount technology (SMT). Other mounting configurations are used in other embodiments.

In accordance with this embodiment, window substrate 202 is used to stack MEMS package 700 on substrate 720. Illustratively, interconnection balls 722 are formed on lands 214 of lower traces 212. Interconnection balls 722 are reflowed to mount lands 214 to terminals 724 of substrate 720.

Substrate 720 can be any one of a number of different types of substrates in accordance with various embodiments. For example, substrate 720 is a printed circuit mother board, a laminate, a flexible connector, ceramic, and/or lead frame substrate, a die, or other type of substrate.

In accordance with this embodiment, window substrate 202 is used as an interposer for stacking of MEMS die 322 and optionally second electronic component 702 on substrate 720.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
    a window substrate comprising:
        a window extending from a top surface to a bottom surface of the window substrate; and
        terminals;
    a Micro Electro Mechanical Systems (MEMS) die comprising:
        an active surface comprising bond pads and a MEMS active area exposed through the window; and
        an inactive surface;
        flip chip bumps coupling the bond pads to the terminals, the MEMS active area being aligned with the window; and
        a magnet coupled to the inactive surface and having a top magnet surface exposed to an ambient environment, wherein the magnet provides a magnetic field for operation of the MEMS die;
    wherein the active surface comprises micromirrors positioned in the magnetic field.

2. The structure of claim 1 further comprising a magnet adhesive coupling a first surface of the magnet to the inactive surface.

3. The structure of claim 1 wherein the MEMS active area is exposed to the ambient environment through the window.

4. The structure of claim 1 wherein the window substrate further comprises:
    window sidewalls extending between the top surface and the bottom surface, the window sidewalls defining the window.

5. The structure of claim 1 further comprising a sealant between the top surface of the window substrate and the active surface of the MEMS die.

6. The structure of claim 5 wherein the sealant extends inwards from sides of the MEMS die to the window sidewalls and encloses the flip chip bumps.

7. The structure of claim 1 further comprising an integrated circuit chip directly coupled to the window substrate at a same side of the window substrate to which the MEMS die is coupled.

8. A method comprising:
coupling bond pads on an active surface of a Micro Electro Mechanical Systems (MEMS) die to terminals on a first surface of a window substrate, a MEMS active area of the MEMS die being aligned with a window of the window substrates;
coupling a magnet to an inactive surface of the MEMS die and having a top magnet surface exposed to an ambient environment, wherein the magnet provides a magnetic field for operation of the MEMS die and wherein the active surface comprises micromirrors positioned in the magnetic field; and
removing a carrier tape from a second surface of the window substrate to expose the MEMS active area to the ambient environment through the window of the window substrate.

9. The method of claim 8 further comprising coupling an integrated circuit to the window substrate at a same side of the window substrate to which the MEMS die is coupled.

10. The method of claim 8 further comprising magnetizing the magnet.

11. The method of claim 10 wherein the magnetizing is perform subsequent to the coupling a magnet.

12. The method of claim 8 wherein the coupling bond pads comprises forming flip chip bumps between the bond pads and the terminals.

13. The method of claim 12 wherein the forming flip chip bumps comprises re-flowing solder at a temperature sufficient to demagnetize the magnet.

14. The method of claim 8 further comprising dispensing a sealant between the active surface of the MEMS die and the first surface of the window substrate.

15. The method of claim 14 wherein the dispensing a sealant comprises curing the sealant at a temperature sufficient to demagnetize the magnet.

16. A method comprising:
coupling a window substrate to a carrier tape, the window substrate comprising a window extending between a first surface of the window substrate and a second surface of the window substrate, the carrier tape sealing the window at the second surface;
coupling bond pads on an active surface of a Micro Electro Mechanical Systems (MEMS) die to terminals of the window substrate, a MEMS active area of the MEMS die being aligned with the window;
coupling a magnet to an inactive surface of the MEMS die and having a top magnet surface exposed to the ambient environment, wherein the magnet provides a magnetic field for operation of the MEMS die and wherein the active surface comprises micromirrors positioned in the magnetic field; and
removing a carrier tape from a second surface of the window substrate to expose the MEMS active area to the ambient environment through the window of the window substrate.

17. The method of claim 16 further comprising dispensing a sealant between the active surface of the MEMS die and the first surface of the window substrate.

18. The method of claim 17 wherein the coupling a magnet is perform subsequent to the coupling bond pads and the dispensing a sealant.

19. A structure comprising:
a Micro Electro Mechanical Systems (MEMS) die that comprises an active surface and an inactive surface, said active surface comprising bond pads and a MEMS active area, said active surface being flip-chip bonded to a first surface of a window substrate, the window substrate comprising a substrate material;
a magnet coupled to the inactive surface of the MEMS die and having a side magnet surface unbounded by substrate material, wherein the magnet provides a magnetic field for operation of the MEMS die; and
a second substrate bonded to a second surface of the window substrate, wherein the MEMS active area is aligned with a window extending from the first surface to the second surface of the window substrate;
wherein the active surface comprises micromirrors positioned in the magnetic field.

20. The structure of claim 19, wherein a second electronic component is directly coupled to the window substrate at a same side of the window substrate to which the MEMS die is coupled.

21. The structure of claim 19, wherein flip chip bumps are between the bond pads and terminals on the first surface of the window substrate.

22. The structure of claim 19, wherein a sealant is between the active surface of the MEMS die and the first surface of the window substrate.

23. The structure of claim 19, wherein the substrate material comprises a printed circuit board, substrate, or laminate material.

24. The structure of claim 19, wherein the MEMS active area is exposed to an ambient environment through the window.

25. A structure comprising:
a Micro Electro Mechanical Systems (MEMS) die that comprises an active surface and an inactive surface, said active surface comprising bond pads and a MEMS active area, said active surface being flip-chip bonded to a first surface of a window substrate, the window substrate comprising a substrate material; and
a magnet coupled to the inactive surface of the MEMS die, the magnet providing a magnetic field for operation of the MEMS die;
wherein side surfaces of the MEMS die are unbounded by substrate material;
wherein the window substrate comprises a window extending from the first surface to a second surface of the window substrate and aligned with the MEMS active area, terminals for coupling to the bond pads, and conductive vias from the terminals to the a second surface of the window substrate; and
wherein the active surface comprises micromirrors positioned in the magnetic field.

26. The structure of claim 25, wherein a electronic component is coupled to the window substrate.

27. The structure of claim 25, wherein flip chip bumps are between the bond pads and terminals on the first surface of the window substrate.

28. The structure of claim 25, wherein a sealant is between the active surface of the MEMS die and the first surface of the window substrate.

29. The structure of claim 25, wherein the substrate material comprises a printed circuit board, ceramic, or laminate material.

30. The structure of claim 25, wherein the MEMS active area is exposed to the ambient environment through the window.

* * * * *